United States Patent
Yabe

(10) Patent No.: US 7,589,512 B2
(45) Date of Patent: Sep. 15, 2009

(54) LOAD CONTROL DEVICE

(75) Inventor: Hiroo Yabe, Susono (JP)

(73) Assignee: Yazaki Corporation, Tokyo (JP)

( * ) Notice: Subject to any disclaimer, the term of this patent is extended or adjusted under 35 U.S.C. 154(b) by 175 days.

(21) Appl. No.: 11/761,434

(22) Filed: Jun. 12, 2007

(65) Prior Publication Data
US 2007/0285136 A1 Dec. 13, 2007

(30) Foreign Application Priority Data
Jun. 12, 2006 (JP) ............................. 2006-161862
Jun. 12, 2006 (JP) ............................. 2006-161873

(51) Int. Cl.
*G05F 1/567* (2006.01)
*H03K 4/06* (2006.01)
(52) U.S. Cl. ...................................... 323/288; 323/138
(58) Field of Classification Search ................. 323/222, 323/223, 282, 288; 327/131, 132, 138
See application file for complete search history.

(56) References Cited

U.S. PATENT DOCUMENTS

| 3,700,934 | A | * | 10/1972 | Swain | 327/513 |
| 3,714,454 | A | * | 1/1973 | Hovens et al. | 307/109 |
| 3,745,373 | A | * | 7/1973 | Jones et al. | 327/132 |
| 5,754,036 | A | * | 5/1998 | Walker | 323/237 |
| 6,339,349 | B1 | * | 1/2002 | Rajagopalan | 327/131 |

FOREIGN PATENT DOCUMENTS

JP 2001-148294 A 5/2001

* cited by examiner

*Primary Examiner*—Gary L Laxton
(74) *Attorney, Agent, or Firm*—Sughrue Mion, PLLC

(57) ABSTRACT

A load control device includes a triangular wave generation portion which generates a triangular wave signal by charging/discharging a capacitor based on a constant current supplied from a constant current source, a load control portion which controls a load based on the triangular wave signal, and a temperature compensation element whose characteristic changes with a rise in temperature, which is provided to the constant current source.

10 Claims, 9 Drawing Sheets

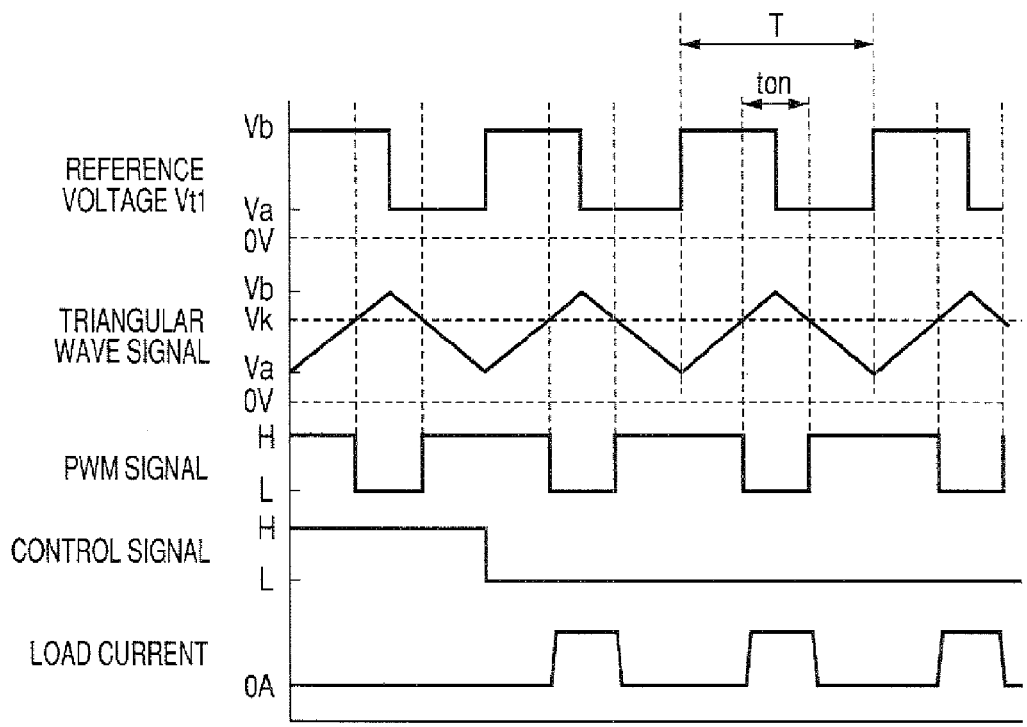

FIG. 7

| | THIRD EMBODIMENT | | | RELATED ART EXAMPLE | | |
|---|---|---|---|---|---|---|
| TEMPERATURE (°C) | 25 | 75 | 125 | 25 | 75 | 125 |
| FREQUENCY OF PWM SIGNAL (Hz) | 100 | 92.5 | 82.8 | 100 | 100 | 100 |
| SWITCHING HEAT (W) | 0.89 | 0.81 | 0.72 | 0.89 | 0.88 | 0.88 |
| ON HEAT (W) | 0.20 | 0.29 | 0.37 | 0.20 | 0.29 | 0.37 |
| TOTAL HEAT (W) | 1.09 | 1.10 | 1.09 | 1.09 | 1.17 | 1.25 |

# LOAD CONTROL DEVICE

BACKGROUND OF THE INVENTION

The present invention relates to a load control device for controlling a load such as a lamp of a vehicle.

Some of the related art load control devices include a triangular wave generation portion, a set voltage generation portion, a comparison portion and a driving control portion. In case a driving instruction signal to instruct driving of a load at a certain level corresponding to a fixed input is supplied, the triangular wave generation portion generates a triangular wave. The set voltage generation portion holds and generates a second set voltage set between the maximum voltage and the minimum voltage of the triangular wave. The comparison portion compares the triangular wave with the second set voltage. The driving control portion thus generates a driving control signal that changes its level with a constant frequency and duty based on the comparison result of the comparison portion.

In case a driving instruction signal to instruct stoppage of driving of a load at a certain level corresponding to a fixed input is supplied, the triangular wave generation portion generates a triangular wave. The set voltage generation portion holds and generates a third set voltage lower than the second set voltage. The comparison portion compares the triangular wave with the third set voltage. The driving control portion thus generates a driving control signal that changes its level with a constant frequency and duty based on the comparison result of the comparison portion.

In case a driving instruction signal that changes its level with a predetermined frequency and duty corresponding to a pulse input, the triangular wave generation portion generates a first set voltage set between the second set voltage and the third set voltage. The set voltage generation portion selectively generates the second set voltage or third set voltage in correspondence to the frequency and duty of the driving instruction signal. The comparison portion compares the first set voltage with the second set voltage or the third set voltage. The driving control portion thus generates a driving control signal that changes its level with the same frequency and duty as those of the driving control signal (for example, refer to JP-A-2001-148294 (claim 1, [A0019] to [A0053], FIGS. 1 to 3)).

In the above related load control device, the driving control portion generates and outputs a driving control signal that changes its level with certain frequency and duty even when the temperature changes. The ON resistance of a power MOS-FET as a load driving element is substantially proportional to temperature and heat increases with temperature. Thus, it is necessary to perform heat dissipation design so that heat dissipation will be permitted at the expected maximum operating temperature. As a result, the device scale increases.

Also, the above load control device according to the related art uses a headlamp mounted on a vehicle such as a two-wheeled vehicle or a four-wheeled vehicle as a load. The headlamp mounted on a vehicle may be one including a low-beam lamp and a high-beam lamp attached to a single reflector or a single headlamp including a filament for low beams and a filament for high beams. Low beams are preferably turned ON so as not to cause glare on the eyes of the driver of a vehicle in front or an oncoming vehicle, if any, in night driving. High beams are preferably turned ON in the absence of a vehicle in front or an oncoming vehicle in night driving.

Some of the above vehicles have a feature called DRL (Daytime Running Light) that forcibly turns ON a headlamp in the daytime also in order to let pedestrians or oncoming cars recognize the presence of the vehicle and prevent possible traffic accidents. Some vehicles equipped with the DRL feature use low beams for DRL while others use high beams for DRL.

The related art load control device is composed of ICs and has a capacitor interposed therein as an external component between a connection terminal and a ground so as to set the frequency of a triangular wave generated by the triangular wave generation portion. In case the capacitor has shorted by some cause, the FET as a load driving element is maintained ON. As a result, in case the load is the headlamp, the headlamp is maintained ON with a 100% duty ratio.

With a vehicle using low beams for DRL, there are no particular problems even when the headlamp keeps lighting. The headlight lighting state ensures safety of the people on the vehicle, pedestrians and oncoming vehicles so that the lighting state is rather favorable from the viewpoint of a fail-safe design. With a vehicle using high beams for DRL, the headlight lighting state is maintained with a 100% duty ratio. This could cause glare with respect to the driver of a vehicle in front or an oncoming vehicle which leads to a traffic accident.

This advantage could be common to any device in general that controls a load based on a generated triangular wave signal.

SUMMARY OF THE INVENTION

The invention has been accomplished in view of the foregoing circumstances. An object of the invention is to provide a load control device that solves the above problems.

In order to solve the above problems, the invention provides a load control device, comprising:

a triangular wave generation portion which generates a triangular wave signal by charging/discharging a capacitor based on a constant current supplied from a constant current source;

a load control portion which controls a load based on the triangular wave signal; and a temperature compensation element whose characteristic changes with a rise in temperature, which is provided to the constant current source.

Preferably, the load control portion includes a pulse width modulation wave generation portion which generates a pulse width modulation wave signal based on the triangular wave signal, and a load driving portion which supplies a load current to the load based on the pulse width modulation wave signal.

Preferably, the temperature compensation element is a diode having a characteristic that the reverse-direction leakage current increases with the rise in temperature.

Preferably, the temperature compensation element is a thermistor having a characteristic that the resistance value drops with the rise in temperature.

In the above configurations, the load control device operates normally at normal temperatures. When the temperature has approached an operating limit, the frequency of a pulse width modulation signal is corrected to decrease the heat value. It is thus unnecessary to make a heat dissipation design to allow heating at an expected maximum operating temperature unlike in the related art practices. As a result, a heat dissipation portion is simplified thus downsizing the load control device.

According to the present invention, there is also provided a load control device for controlling a load based on a generated triangular wave signal, comprising:

a triangular wave generation portion which generates the triangular wave signal having the same frequency in a first interposing state where a capacitor for setting the frequency of the triangular wave signal is interposed between a power source and an input end of a comparison portion and a second interposing state where the capacitor is interposed between a ground and the input end of the comparison portion, wherein the capacitor is configured to be interposed in either the first interposing state or the second interposing state.

Preferably, the load control device further comprises a pulse width modulation wave generation portion which generates a pulse width modulation wave signal based on the triangular wave signal, and a load control portion which controls the load based on the pulse width modulation wave signal.

According to the above configurations, it is possible to enhance the safety of a load control device subjected to a short of a capacitor. In case the load control device is mounted on a vehicle and the headlamp of a vehicle is used as a load and low beams are used for DRL, it is possible to assure a fail-safe design. In case high beams are used for DRL, it is possible to enhance the safety. It is unnecessary to manufacture two types of printed circuit boards depending on the type of vehicle using the load control device. This contributes to reduced costs.

BRIEF DESCRIPTION OF THE DRAWINGS

The above objects and advantages of the present invention will become more apparent by describing in detail preferred exemplary embodiments thereof with reference to the accompanying drawings, wherein:

FIG. 3 is a timing chart used to illustrate an exemplary operation of the load control device shown in FIG. 1;

FIG. 4 shows an exemplary result of comparison between a case where a lamp of a certain rating is actually driven by a load control device according to first embodiment and a case where the same lamp is actually driven in accordance with the related art;

FIG. 7 shows an exemplary result of comparison between a case where a lamp of a certain rating is actually driven by a load control device according to the third embodiment and a case where the same lamp is actually driven in accordance with the related art;

DETAILED DESCRIPTION OF THE PREFERRED EMBODIMENTS

First Embodiment

Figure 1:
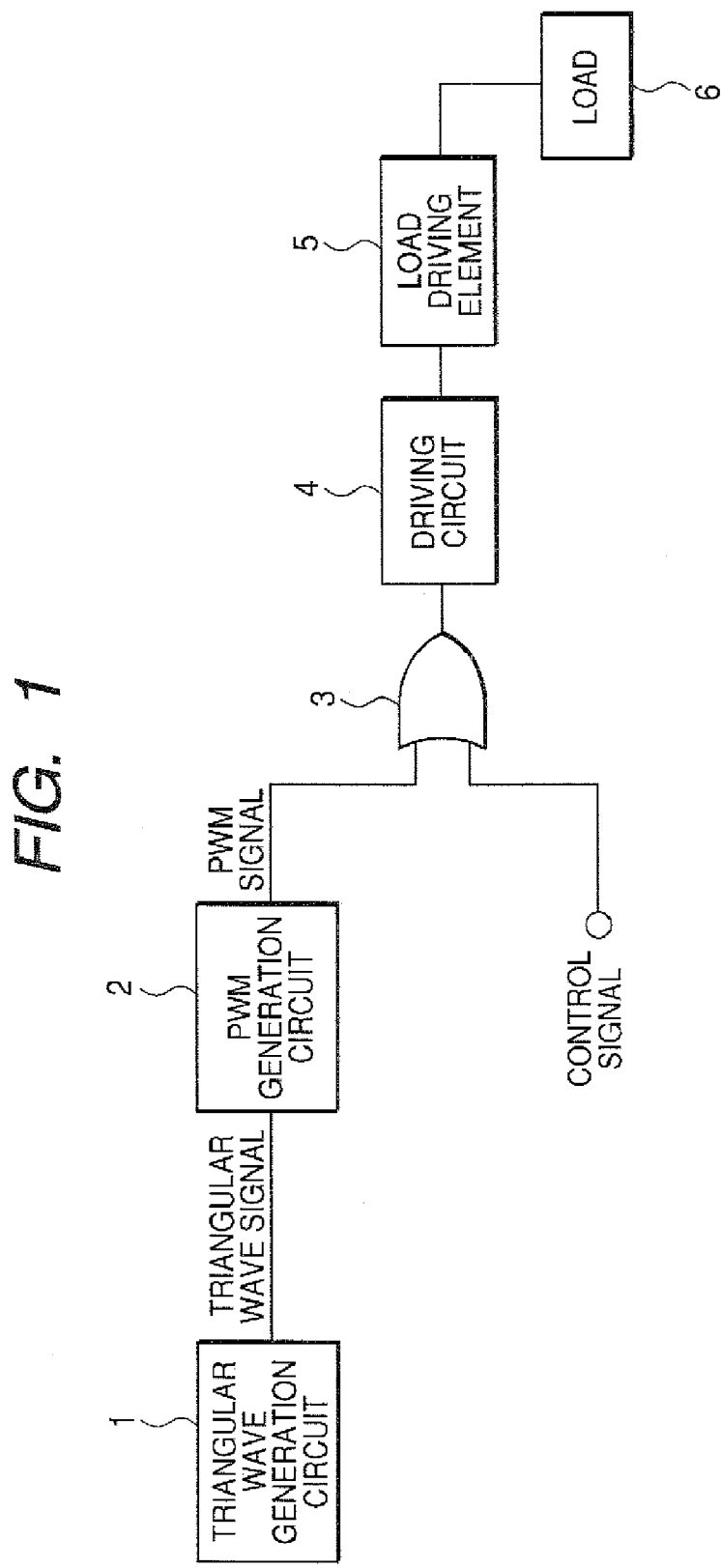
FIG. 1 is a block diagram showing the configuration of a load control device according to a first embodiment of the invention.

FIG. 1 is a block diagram showing the configuration of a load control device according to a first embodiment of the invention. The load control device according to the first embodiment includes a triangular wave generation circuit 1, a pulse width modulation (PWM) wave generation portion 2, an OR gate 3, a driving circuit 4, and a load driving element 5. The triangular wave generation circuit 1 generates a triangular wave signal of a predetermined frequency and shape by switching between charging and discharging of an external capacitor C1 for frequency setting.

The PWM generation circuit 2 generates a PWM signal (at "H" (High) level or "L" (Low) level) based on a triangular wave signal supplied from a triangular wave generation circuit 1. The OR gate 3 supplies to the driving circuit 4 a logical value (at "H" (High) level or "L" (Low) level) obtained through logical OR operation of a control signal (at "H" (High) level or "L" (Low) level) supplied externally and a PWM signal (at "H" (High) level or "L" (Low) level) supplied from the PWM generation circuit 2. The driving circuit 4 amplifies and inverts the logical value supplied from the OR gate 3 and applies a driving voltage to the load driving element 5. When the driving voltage is applied from the driving circuit 4, the load driving element 5 supplies a load current to a load 6.

Figure 2:
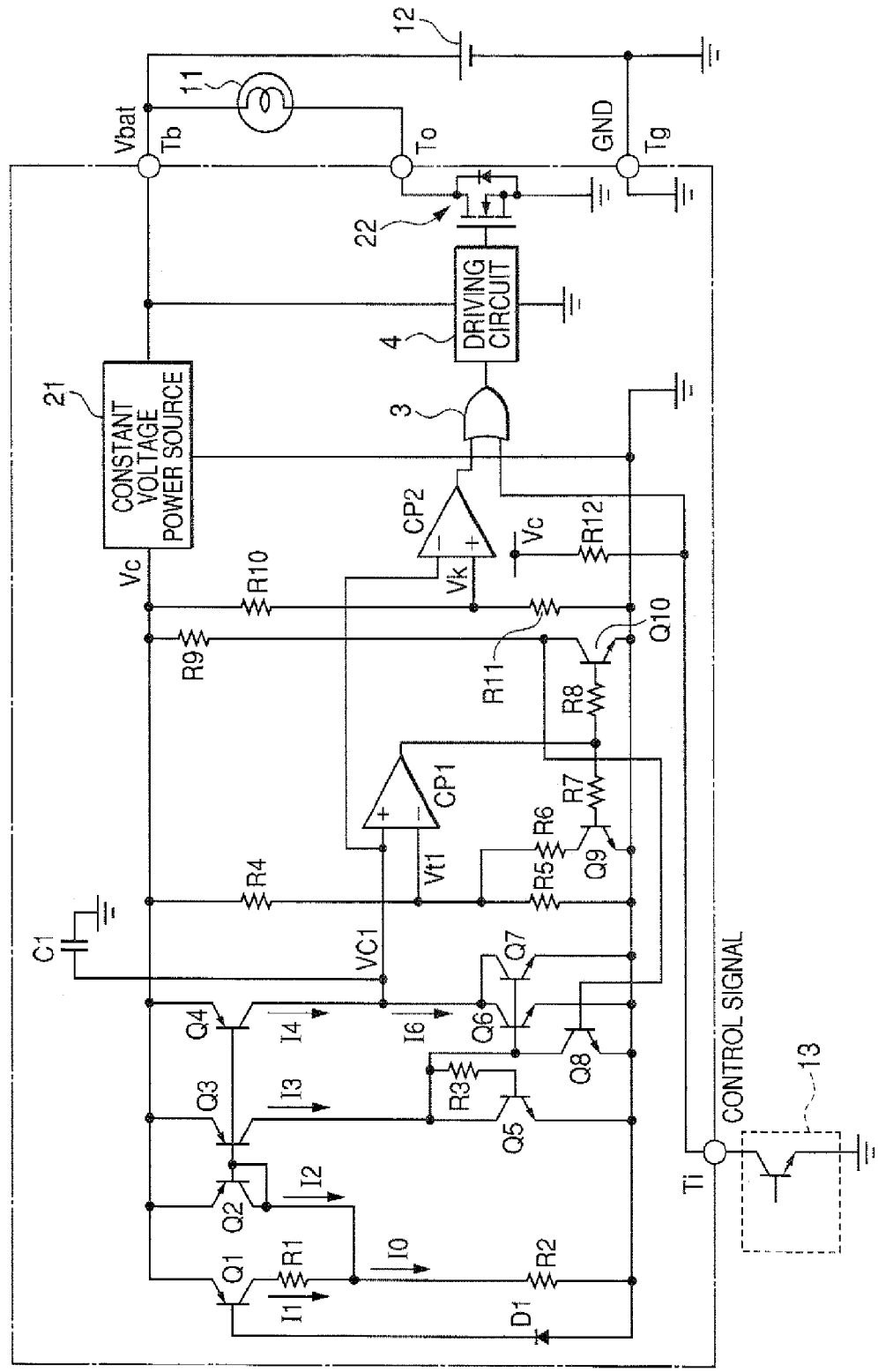
FIG. 2 is a circuit diagram as a particular implementation of the configuration of the load control device shown in FIG. 1.

FIG. 2 is a circuit diagram as a particular implementation of the block diagram of a load control device shown in FIG. 1. In FIG. 2, a portion enclosed by alternate long and short dashed lines constitutes a load control device. Components of the load control device including transistors Q1 to Q10, resistors R1 to R12, comparators CP1, CP2, an OR gate 3, a driving circuit 4 and a constant voltage power source 21 are composed of ICs. That is, a capacitor C1 and an N-channel MOSFET 22 as a load driving element 5 are external components of the ICs.

The load control device of this embodiment is a device (low-side switching device) that includes an N-channel MOSFET 22 as a load driving element 5 downstream a lamp 11 as a load 6. The load control device is mounted for example on a vehicle. FIG. 2 shows a lamp 11 used as a headlamp which serves as the load 6 shown in FIG. 1. The lamp 11 is connected between the power terminal Tb and the output terminal To of the load control device. In FIG. 2, a battery 12 mounted on a vehicle is used as a power source. A battery voltage $V_{bat}$ is connected between the power terminal Tb and the ground terminal Tg of the load control device.

In FIG. 2, a control signal (at "H" (High) level or "L" (Low) level) (fixed input) outputted from an ECU (Electronic Control Unit) 13 mounted on a vehicle is supplied to the load control device. The ECU controls the fuel injection amount or ignition timing of the engine of a vehicle to control the engine or controls an automatic transmission or traction control.

In FIG. 2, PNP transistors Q1 to Q4, PNP transistors Q5 to Q10, resistors R1 to R9, a comparator CP1 and a capacitor C1 constitute a triangular wave generation circuit 1 shown in FIG. 1. The transistors Q2 to Q4 constitute a current mirror circuit (constant current source). The emitter area of each of the transistors Q2 to Q4 is the same. Thus, collector currents I2 to I4 flowing through the collectors of the transistors Q2 to Q4 are the same. That is, Expression (1) is satisfied.

$$I2=I3=I4 \qquad (1)$$

where a current I0 flowing through a resistor R2 is represented by Expression (2) using a constant voltage Vc, the base-emitter voltage $V_{BE2}$ of the transistor Q2 and the resistor R2.

$$I0=(Vc-V_{BE2})/R2 \qquad (2)$$

The transistor Q1 is used for amplification. A diode D1 has a p-n junction and a characteristic that a reverse-direction leakage current increases with a rise in temperature. A current I1 flowing through the resistor R1 is a current that bypasses part of the current I0 from the transistor Q2. Given the reverse-direction leakage current of the diode D1 as Ird1 and the dc current amplification ratio of the transistor Q1 as hfeq1, the current I1 is represented by the expression (3) in the state that the transistor Q1 is not saturated.

$$I1=Ird1\times hfeq1 \qquad (3)$$

From Expression (2) and Expression (3), the current I2 is represented by Expression (4).

$$I2=I0-I1=\{(Vc-V_{BE2})/R2\}-Ird1\times hfeq1 \qquad (4)$$

The collector currents I2 to I4 are constant currents as a reference for charging or discharging the capacitor C1. The collector current I4 is a current used to charge the capacitor C1 with electric charges.

The transistors Q5 to Q7 constitute a current mirror circuit (constant current source). The resistor R3 is provided to compensate for the base current of the transistor Q5. The ratio of the emitter area of the transistor Q5 to the total emitter area of the transistors Q6 and Q7 is 1:2. The collector current flowing in the collector of the transistor Q5 is equal to the collector current I3 of the transistor Q3. Further, from Expression (1), the collector current I3 of the transistor Q3 is equal to the collector current I2 of the transistor Q2.

Thus, the collector current I6 flowing in the transistor Q6 is twice each of the collector currents I2 to I4 of the transistors Q2 to Q4. That is, Expression (5) is satisfied.

$$I6=2\times I2=2\times I3=2\times I4 \qquad (5)$$

The collector current I6 is a current used to discharge the electric charges accumulated on the capacitor C1.

The transistor Q8 is provided to shut down the supply of the collector current I6 when turned ON. The transistor Q8 and the resistors R4 to R6 generate a reference voltage Vt1 for generating the triangular wave signal. The resistor R7 is a base resistor connected between the base of the transistor Q9 and the output terminal of the comparator CP1.

The transistor Q10 and resistors R8 and R9 constitute a circuit for turning ON/OFF the transistor Q8 by way of the output signal of the comparator CP1. In the triangular wave generation circuit 1, the comparator CP1 compares the voltage VC1 of the capacitor C1 with a reference voltage Vt1 based on a constant current obtained by a current mirror circuit (constant current source) composed of transistors Q2 to Q4, a current mirror circuit (constant current source) composed of transistors Q5 to Q7 and a resistor R2 respectively connected to a constant voltage Vc. The triangular wave generation circuit 1 thus switches between charging and discharging of the capacitor C1 to generate a triangular wave signal.

The comparator CP2 and resistors R10 and R11 constitute a PWM generation circuit 2 shown in FIG. 1. The resistors R10 and R11 generate a reference voltage Vk for generating the PWM signal. The reference voltage Vk is represented by Expression (6).

$$Vk=Vc\times R11/(R10+R11) \qquad (6)$$

In the PWM generation circuit 2, the comparator CP2 compares a triangular wave signal supplied from the triangular wave generation circuit 1 with the reference voltage Vk. The PWM generation circuit 2 thus generates a PWM signal.

The resistor R12 is interposed between a power source Vc and an input terminal Ti and functions as a pull-up resistor to stably hold the potential of a control signal supplied from the ECU 13. The constant voltage power source 21 generates a constant voltage Vc from a battery voltage $V_{bat}$ supplied from a battery 12 and supplies the constant voltage Vc to each part of the load control device. The MOSFET 22 has its gate connected to the output terminal of the driving circuit 4 and its drain connected to the output terminal To of the load control device and its source grounded.

Operation of the load control device of this configuration will be described referring to the timing chart shown in FIG. 3. As shown in FIG. 3, in case the control signal supplied from the ECU 13 is High, the output signal of the OR gate 3 is always High. The driving circuit 4 amplifies and inverts the logical value of High level supplied from the OR gate 3 and applies a Low driving voltage to the MOSFET 22. While the Low driving voltage is applied from the driving circuit 4, the MOSFET 22 has its gate voltage driven Low so that it is turned OFF. In this case, the source voltage of the MOSFET 22 is almost equal to the battery voltage $V_{bat}$ so that a load current does not flow into a load 6, or a lamp 11 in this example as shown in FIG. 3.

As shown in FIG. 3, in case the control signal supplied from the ECU 13 is Low, the output signal of the comparator CP2 of the PWM generation circuit 2 serves as an output signal of the OR gate 3.

In case the voltage VC1 of the capacitor C1 is lower than the reference voltage Vt1 at a certain time, the output signal of the comparator CP1 is driven Low and the transistors Q9 and Q10 are turned OFF. While the transistor Q9 is turned OFF, the reference voltage Vt1 is the upper limit voltage Vb of the triangular wave signal as shown in FIG. 3. The upper limit voltage Vb is represented by Expression (7).

$$Vb=Vc\times R5/(R4+R5) \qquad (7)$$

When the transistor Q10 is turned OFF, a current flows into the base of the transistor Q8 from the resistor R9 so that the transistor Q8 is turned ON. When the transistor Q8 is turned ON, supply of a collector current I6 is stopped. As a result, a collector current I4 flows, which charges the capacitor C1 with electric charges and the voltage across the terminals of the capacitor C1 increases. The voltage VC1 of the capacitor C1 rises.

When the voltage VC1 of the capacitor C1 exceeds the upper limit voltage Vb even by a small amount, the output signal of the comparator CP1 is driven High, which turns ON the transistors Q9 and Q10. While the transistor Q9 is turned ON, without considering the saturation voltage of the transistor Q9, the reference voltage Vt1 becomes a resistance dividing voltage of the composite resistance value of the resistors R5 and R6 and the resistance value of the resistor R4, and as shown in FIG. 3, becomes the lower limit voltage Va of the triangular wave signal. The lower limit voltage Va is represented by Expression (8).

$$Va=Vc\times(R5\times R6)/(R4\times R5+R4\times R6+R5\times R6) \qquad (8)$$

When the transistor Q10 is turned ON, a current does not flow from the resistor R9 to the base of the transistor Q8. This turns OFF the transistor Q8. When the transistor Q8 is turned OFF, supply of the collector current I6 starts. As mentioned above, the collector current I6 is double the collector current I4. Thus, the electric charges accumulated on the capacitor C1 are discharged with a current value obtained by subtracting the collector current I4 from the collector current I6. When the electric charges accumulated on the capacitor C1 are discharged, the voltage across the terminals of the capacitor C1 drops. Thus, the voltage VC1 of the capacitor C1 drops. When the voltage VC1 of the capacitor C1 drops below the lower limit voltage Va even by a small amount, the output signal of the comparator CP1 is inverted to Low. These operations are repeated to generate the triangular wave signal shown in FIG. 3.

When the triangular wave signal supplied from the triangular wave generation circuit 1, that is, the voltage VC1 of the capacitor C1 exceeds the reference voltage Vk, the output signal of the comparator CP2 of the PWM generation circuit 2 is driven Low. When the voltage VC1 of the capacitor C1 drops below the reference voltage Vk, the output signal of the comparator CP2 is driven High. These operations are repeated to generate the PWM signal shown in FIG. 3.

The output signal of the comparator CP2, that is, the PWM signal is supplied to the driving circuit 4 via the OR gate 3. The driving circuit 4 amplifies and inverts the logical value of the PWM signal supplied from the OR gate 3 and applies a driving voltage to the MOSFET 22. While the driving voltage applied from the driving circuit 4 is High, the MOSFET 22 has its gate voltage driven High so that it is turned ON. The source voltage of the MOSFET 22 is almost equal to the ground voltage. As shown in FIG. 3, a load current flows into a load 6, or a lamp 11 in this example.

In case the driving voltage from the driving circuit 4 is Low, the MOSFET 22 is turned OFF. Thus, the source voltage of the MOSFET 22 rises until it is almost equal to the battery voltage $V_{bat}$. As shown in FIG. 3, a load current does not flow into a load 6, or a lamp 11 in this example.

These operations are repeated to drive the lamp 11 to blink based on the supplied driving voltage.

The period T of the triangular wave signal will be described. While the transistor Q1 is not saturated, the current I1 is represented by Expression (3) above. The period T of the triangular wave signal is represented by Expression (9).

$$T = 2 \times (Vb - Va) \times C1 / I2 = [2 \times Vc \times \qquad (9)$$
$$\{(R5/(R4+R5)) - (R5 \times R6)/(R4 \times R5 + R4 \times R6 + R5 \times R6)\} \times$$
$$C1]/[\{(Vc - V_{BE2})/R1\} - Ird1 \times hfeq1]$$

The voltage $V_{BE2}$ across the base and emitter of the transistor Q2 has a temperature characteristic of around 2 mV/° C. so that it may be regarded as almost constant. Thus, the period T of the triangular wave signal is influenced by the leakage current Ird1 of the diode D1 and the dc current amplification ratio hfeq1 of the transistor Q1. The reverse-direction leakage current Ird1 of the diode D1, similar to the dc current amplification ratio hfeq1 of the transistor Q1, has a characteristic that it increases with a rise in temperature. As the temperature rises, the period T of the triangular wave signal becomes longer than Expression (9). In other words, the frequency of the triangular wave signal drops.

When the current I1 increases and the transistor Q1 is saturated, the saturation voltage is almost 0 volts so that the current I1 is represented by Expression (10).

$$I1 = V_{BE2}/R1 \qquad (10)$$

In case the reverse-direction current Ird1 of the diode D1 increases and the transistor Q1 is saturated, it is necessary to apply Expression (10) in place of Expression (3) for the current I1. The period T of the triangular wave signal thus becomes constant as represented by Expression (11). As a result, even when the reverse-direction Ird1 of the diode D1 has increased, the period T of the triangular wave signal does not become longer than necessary.

$$T = 2 \times (Vb - Va) \times C1 / I2 = [2 \times Vc \times \qquad (11)$$
$$\{(R5/(R4+R5)) - (R5 \times R6)/(R4 \times R5 + R4 \times R6 + R5 \times R6)\} \times$$
$$C1]/[\{(Vc - V_{BE2})/R1\} - V_{BE2}/R1)]$$

FIG. 4 shows an exemplary result of comparison between a case where a lamp of a certain rating is actually driven by a load control device of the above configuration and a case where the same lamp is actually driven in accordance with the related art. In this comparison experiment, setting is made so that the frequency of a PWM signal is 100 Hz at a temperature of 25° C. both in First embodiment and related art example. The duty ratio of the PWM signal is 50%, the ON resistance of the MOSFET as a load driving element 5 at 25° C. is set to 30 mΩ, and the ON resistance temperature coefficient of the MOSFET is 0.8%/° C.

In FIG. 4, the switching heat refers to a total of heat generated when the MOSFET is turned ON and turned OFF. The ON heat refers to the heat in a period where the MOSFET is on past the turn-on period until it shifts to the turn-off period. The total heat is a total of switching heat and ON heat, that is, heat of the actual MOSFET. From FIG. 4, it is understood that the total heat increases with a rise in temperature in the related art example while the total heat drops at 125° C., an operation limit temperature in First embodiment.

In this way, according to First embodiment of the invention, A diode D1 having a characteristic that the reverse-direction leakage current increases with a rise in temperature, a fixed resistor R1 and a transistor Q1 for amplification are added to a transistor Q2 of the current mirror circuit (constant current source). Thus, the load control device operates normally at normal temperatures. When the temperature has exceeded 75° C. and approached an operation limit, the frequency of the PWM signal is corrected to decrease heat. It is thus unnecessary to make a heat dissipation design to allow heating at an expected maximum operating temperature unlike in the related art practices. As a result, a heat dissipation portion is simplified thus downsizing the load control device.

Second Embodiment

While the diode D1 having a p-n junction is used in the first embodiment, the invention is not limited thereto. For example, a Schottky barrier diode may be used instead of the diode D1. In case a high temperature leakage current that flows with a rise in the temperature of a Schottky barrier diode is large enough, a PNP transistor Q1 may be omitted as shown in FIG. 5.

Figure 5:
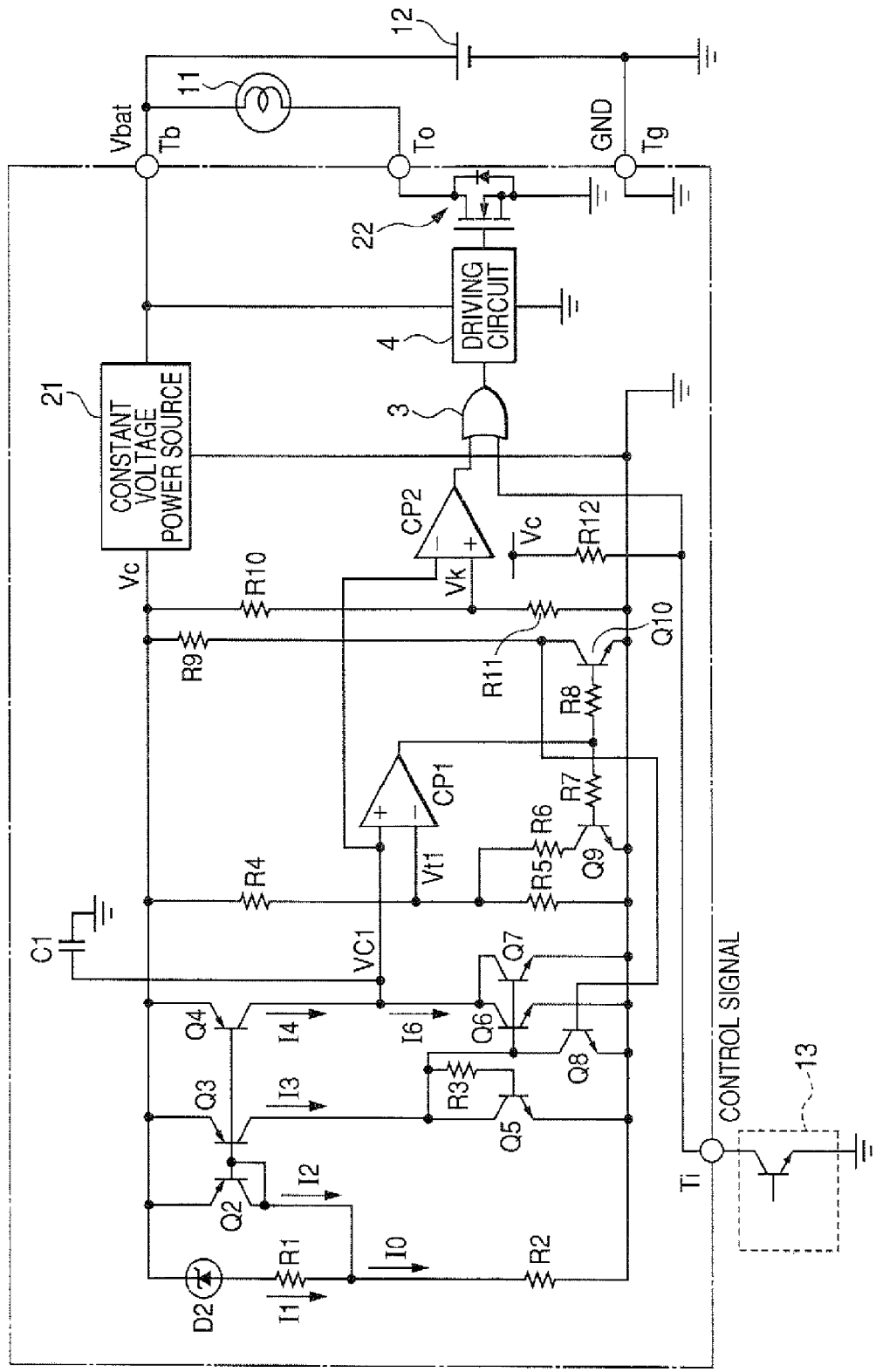
FIG. 5 is a circuit diagram showing the configuration of a load control device according to a second embodiment of the invention.

FIG. 5 is a circuit diagram showing the configuration of a load control device according to Second embodiment of the invention. In FIG. 5, a same component as that in FIG. 2 is given a same sign and the corresponding description is omitted. The load control device shown in FIG. 5 differs from that shown in FIG. 2 in that a Schottky barrier diode D2 is provided anew instead of a diode D1 having a p-n junction and a PNP transistor Q1 is removed. Operation of the load control device in this example is almost the same as that in First embodiment so that its description is omitted.

In this way, according to Second embodiment of the invention, a Schottky barrier diode D2 having a characteristic that a high temperature leakage current increases substantially with a rise in temperature and a fixed resistor R1 are added to a transistor Q2 of the current mirror circuit (constant current source). This provides almost the same effect as that of First embodiment.

Third Embodiment

Figure 6:
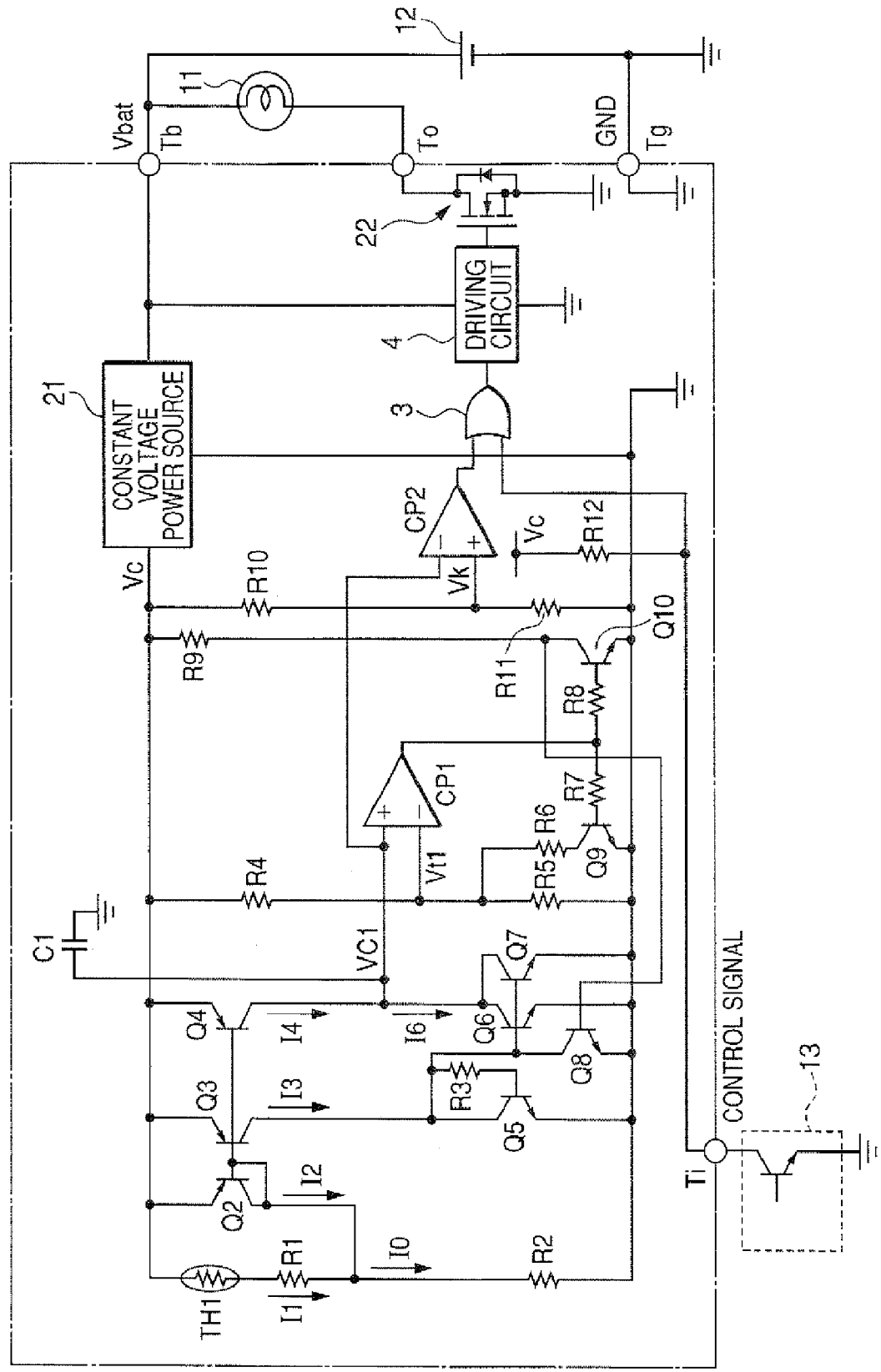
FIG. 6 is a circuit diagram showing the configuration of a load control device according to a third embodiment of the invention.

FIG. 6 is a circuit diagram showing the configuration of a load control device according to the third embodiment of the invention.

In FIG. 6, a same component as that in FIG. 2 is given a same sign and the corresponding description is omitted. The load control device shown in FIG. 6 differs from that shown in FIG. 2 in that a thermistor TH1 is provided anew instead of PNP transistor Q1 and a diode D1 is removed.

The thermistor TH1 has a characteristic that the resistance value drops with a rise in temperature. The thermistor TH1 is called an NTC (negative temperature coefficient) thermistor where a change in temperature is proportional to a change in resistance value. The thermistor TH1 is produced for example by mixing oxides such as nickel (Ni), manganese (Mn), cobalt (Co) and iron (Fe) and sintering the resulting mixture.

Referring to FIG. 6, a thermistor TH1, transistors Q2 to Q10, resistors R1 to R9, a comparator CP1 and a capacitor C1 constitute a triangular wave generation circuit 1 shown in FIG. 1. The transistors Q2 to Q4 constitute a current mirror circuit (constant current source). The emitter area of each of the transistors Q2 to Q4 is the same. Thus, a collector current I2 to I4 flowing through each of the collectors of the transistors Q2 to Q4 is the same. That is, Expression (1) is satisfied.

$$I2 = I3 = I4 \quad (1)$$

where a current I0 flowing through a resistor R2 is represented by Expression (2) using a constant voltage Vc, the base-emitter voltage $V_{BE2}$ of the transistor Q2 and the resistor R2.

$$I0 = (Vc - V_{BE2})/R2 \quad (2)$$

A current I1 flowing through the resistor R1 is a current that bypasses part of the current I0 from the transistor Q2. Given the resistance value of the thermistor TH1 as Rth1, the current I1 is represented by the expression (12).

$$I1 = V_{BE2}/(Rth1 + R1) \quad (12)$$

From Expression (2) and Expression (12), the current I2 is represented by Expression (13).

$$I2 = I0 - I1 = \{(Vc - V_{BE2})/R2\} - \{V_{BE2}/(Rth1 + R1)\} \quad (13)$$

The collector currents I2 to I4 are constant currents as a reference for charging or discharging the capacitor C1. The collector current I4 is a current used to charge the capacitor C1 with electric charges.

The configuration of a load control device according to Third embodiment of the invention after a transistor Q5 is the same as that of the load control device according to First embodiment (refer to FIG. 2) described earlier so that the corresponding description is omitted. The operation of the load control device of the above configuration is substantially the same as the operation of the load control device explained above with reference to the timing chart shown in FIG. 3.

The period T of the triangular wave signal generated by the triangular wave generation circuit 1 is represented by Expression (14).

$$T = 2 \times (Vb - Va) \times C1/I2 = [2 \times Vc \times \\ \{(R5/(R4+R5)) - (R5 \times R6)/(R4 \times R5 + R4 \times R6 + R5 \times R6)\} \times \\ C1]/[\{(Vc - V_{BE2})/R1\} - V_{BE2}/(Rth1 + R1)] \quad (14)$$

The voltage $V_{BE2}$ across the base and emitter of the transistor Q2 has a temperature characteristic of around 2 mV/° C. so that it may be regarded as almost constant. Thus, the period T of the triangular wave signal is influenced only by the resistance value Rh1 of the thermistor TH1. The thermistor TH1 has a characteristic that the resistance value drops with a rise in temperature. As the temperature rises, the period T of the triangular wave signal becomes longer than Expression (14). In other words, the frequency of the triangular wave signal drops.

FIG. 7 shows an exemplary result of comparison between a case where a lamp of a certain rating is actually driven by a load control device of the above configuration and a case where the same lamp is actually driven in accordance with the related art. In this comparison experiment, an NTC thermistor is used as a thermistor TH1 with the resistance value Rth1 at a temperature of 25° C. being 100 kΩ and the B constant being 4500. The other conditions and meanings of words shown in FIG. 7 are the same as those of First embodiment described referring to FIG. 4. From FIG. 7, it is understood that, while the total heat increases with a rise in temperature in the related art example, increase in the total heat is suppressed despite a rise in temperature in the third embodiment.

In this way, according to The third embodiment of the invention, a thermistor TH1 having a characteristic that the resistance value drops with a rise in temperature and a fixed resistor R1 are added to a transistor Q2 of the current mirror circuit (constant current source). This provides almost the same effect as that of the first embodiment.

Fourth Embodiment

Figure 8:
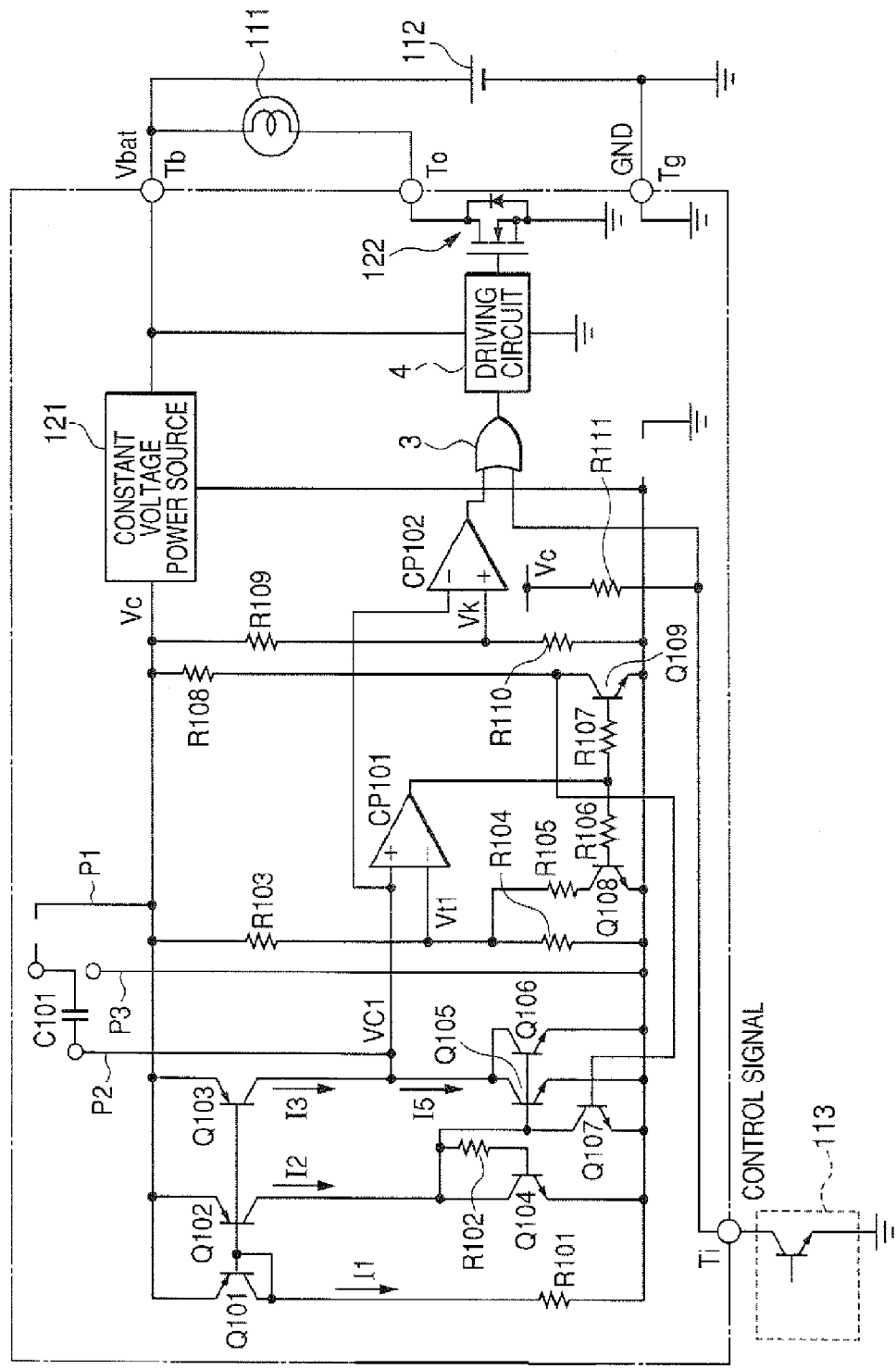
FIG. 8 is a circuit diagram as an another particular implementation of the configuration of the load control device shown in FIG. 1.

FIG. 8 is a circuit diagram as an another particular implementation of the block diagram of a load control device shown in FIG. 1. In FIG. 8, a portion enclosed by alternate long and short dashed lines constitutes a load control device. Components of the load control device including transistors Q101 to Q109, resistors R101 to R11, comparators CP101, CP102, an OR gate 3, a driving circuit 4 and a constant voltage power source 121 are composed of ICs. That is, a capacitor C101 and an N-channel MOSFET 122 as a load driving element 5 are external components of the ICs.

The load control device in this embodiment is a device (low-side switching device) that includes an N-channel MOSFET 122 as a load driving element 5 downstream a lamp 111 as a load 6. The load control device is mounted for example on a vehicle. As the load 6 shown in FIG. 1, a lamp 111 used as a headlamp is used in FIG. 8. The lamp 111 is connected between the power terminal Tb and the output terminal To of the load control device. In FIG. 8, a battery 112 mounted on a vehicle is used as a power source. A battery voltage $V_{bat}$ is connected between the power terminal Tb and the ground terminal Tg of the load control device.

In FIG. 8, a control signal (at "H" (High) level or "L" (Low) level) (fixed input) outputted from an ECU (Electronic Control Unit) 113 mounted on a vehicle is supplied to the load control device. The ECU is designed to control the fuel injection amount or ignition timing of the engine of a vehicle to control the engine or control an automatic transmission or traction control.

In FIG. 8, PNP transistors Q101 to Q103, PNP transistors Q104 to Q109, resistors R101 to R108, a comparator CP101 and a capacitor C101 constitute a triangular wave generation circuit 1 shown in FIG. 1. The transistors Q101 to Q103 constitute a current mirror circuit. The emitter area of each of the transistors Q101 to Q103 is the same. Thus, collector currents I1 to I3 flowing through the collectors of the transistors Q101 to Q103 are the same. That is, Expression (1) is satisfied.

$$I1=I2=I3 \quad (1)$$

where a collector current I1 is represented by Expression (2) using a constant voltage Vc, the base-emitter voltage $V_{BE1}$ of the transistor Q1 and the resistor R1.

$$I1=(Vc-V_{BE1})/R1 \quad (2)$$

The collector currents I1 to I3 are constant currents as a reference for charging or discharging the capacitor C101. The collector current I3 is a current used to discharge the electric charges accumulated on the capacitor C101 or charge the capacitor C101 with electric charges.

The transistors Q104 to Q106 constitute a current mirror circuit (constant current source). The resistor R102 is provided to compensate for the base current of the transistor Q104. The ratio of the emitter area of the transistor Q104 to the total emitter area of the transistors Q105 and Q106 is 1:2. The collector current flowing in the collector of the transistor Q104 is equal to the collector current I2 of the transistor Q102. Further, from Expression (1), the collector current I2 of the transistor Q102 is equal to the collector current I1 of the transistor Q101.

Thus, the collector current I5 flowing in the transistor Q105 is twice each of the collector currents I1 to I3 of the transistors Q101 to Q103. That is, Expression (3) is satisfied.

$$I5=2\times I1=2\times I2=2\times I3 \quad (3)$$

The collector current I5 is a current used to charge the capacitor C101 with electric charges or discharge the electric charges accumulated on the capacitor C101.

The transistor Q107 is provided to shut down the supply of the collector current I5 when turned ON. The transistor Q108 and the resistors R103 to R105 generate a reference voltage Vt1 for generating the triangular wave signal. The resistor R106 is a base resistor connected between the base of the transistor Q108 and the output terminal of the comparator CP101.

The transistor Q109 and resistors R107 and R108 constitute a circuit for turning ON/OFF the transistor Q107 by way of the output signal of the comparator CP1. In the triangular wave generation circuit 1, the comparator CP101 compares the voltage VC1 of the capacitor C101 with a reference voltage Vt1 based on a constant current obtained by a current mirror circuit composed of transistors Q101 to Q103, a current mirror circuit composed of transistors Q104 to Q106 and a resistor R101 respectively connected to a constant voltage Vc. The triangular wave generation circuit 1 thus switches between charging and discharging of the capacitor C101 to generate a triangular wave signal.

The comparator CP102 and resistors R109 and R110 constitute a PWM generation circuit 2 shown in FIG. 1. The resistors R109 and R110 generate a reference voltage Vk for generating the PWM signal. The reference voltage Vk is represented by Expression (15).

$$Vk=Vc\times R110/(R109+R110) \quad (15)$$

In the PWM generation circuit 2, the comparator CP102 includes a triangular wave signal supplied from the triangular wave generation circuit 1 with the reference voltage Vk. The PWM generation circuit 2 thus generates a PWM signal.

The resistor R111 is interposed between a power source Vc and an input terminal Ti and functions as a pull-up resistor to stably hold the potential of a control signal supplied from the ECU 113. The constant voltage power source 121 generates a constant voltage Vc from a battery voltage $V_{bat}$ supplied from a battery 112 and supplies the constant voltage Vc to each part of the load control device. The MOSFET 122 has its gate connected to the output terminal of the driving circuit 4 and its drain connected to the output terminal To of the load control device and its source grounded.

Operation of the load control device of this configuration will be described. It is assumed that the load control device of the above configuration includes an IC where transistors Q101 to Q109, resistors R101 to R111, comparator CP101, CP102, an OR gate 3, a driving circuit 4 and a constant voltage power source 121 are arranged on its internal chip, a capacitor C101 and a MOSFET 122 mounted on a single printed circuit board.

Figure 9:
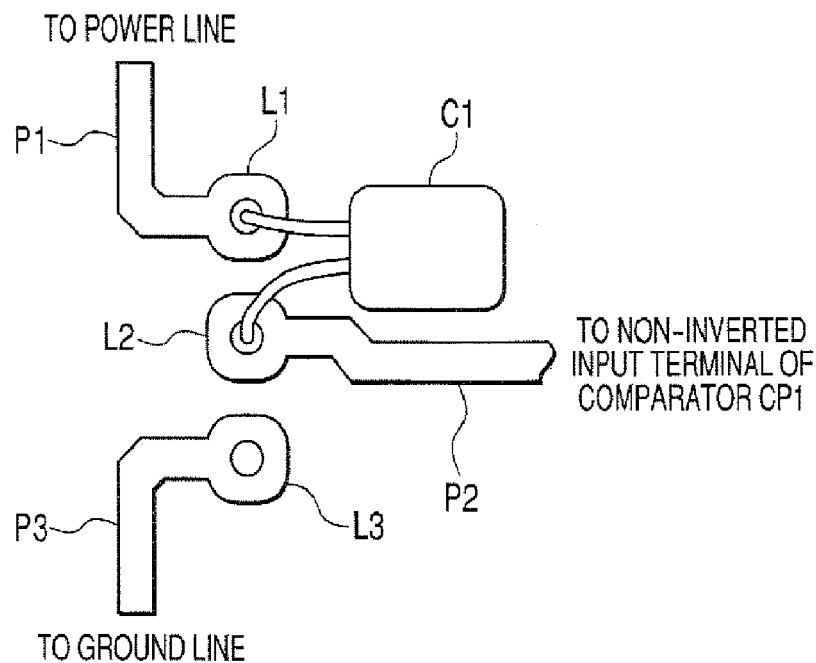
FIG. 9 shows an exemplary configuration of the patterns P1 to P3 and lands L1 to L3 formed on a printed circuit board where the load control device shown in FIG. 1 is mounted and an exemplary mounting state of the capacitor C1.

For example as shown in FIG. 9, on this printed circuit board is formed patterns P1 to P3 for mounting a capacitor C101 as an external component of the IC. At the ends of the patterns P1 to P3 are respectively formed lands L1 to L3. The pattern P1 is connected to a power line that connects to the output terminal of the constant voltage power source 121 shown in FIG. 8. The pattern P2 is connected to the non-inverted input terminal of the comparator CP101 shown in FIG. 8. The pattern P3 is connected to the ground line shown in FIG. 8.

(1) In case a vehicle where this load control device is mounted uses low beams for DRL:

In this case, as shown in FIG. 9, one terminal of the capacitor C101 is inserted into a through hole made almost in the center of the land L1 formed at an end of the pattern P1 and the other terminal of the capacitor C101 is inserted into a through hole made almost in the center of the land L2 formed at an end of the pattern P2. Next, for example by melting cream solder previously applied on the lands L1 and L2, one terminal of the capacitor C101 and the land L1 are electrically connected to each other and the other terminal of the capacitor C101 and the land L2 are electrically connected to each other.

Figure 10:
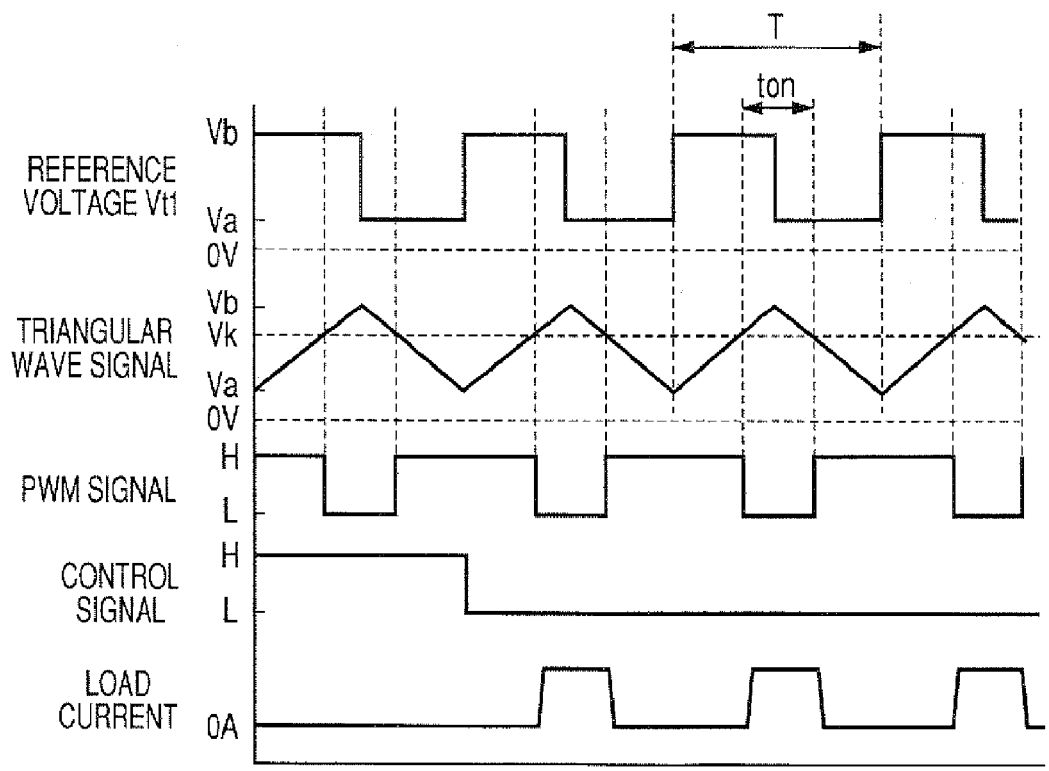
FIG. 10 is a timing chart used to illustrate an exemplary operation of the load control device shown in FIG. 1.

Next, operation of the load control device of the above configuration will be described referring to the timing chart shown in FIG. 10. As shown in FIG. 10, in case the control signal supplied from the ECU 113 is High, the output signal of the OR gate 3 is always High. The driving circuit 4 amplifies and inverts the logical value of High level supplied from the OR gate 3 and applies a Low driving voltage to the MOSFET 122. While the Low driving voltage is applied from the driving circuit 4, the MOSFET 122 has its gate voltage driven Low so that it is turned OFF. In this case, the source voltage of the MOSFET 122 is almost equal to the battery voltage $V_{bat}$ so that a load current does not flow into a load 6, or a lamp 111 in this example as shown in FIG. 10.

As shown in FIG. 10, in case the control signal supplied from the ECU 113 is Low, the output signal of the comparator CP102 of the PWM generation circuit 2 serves as an output signal of the OR gate 3.

In case the voltage VC1 of the capacitor C101 is lower than the reference voltage Vt1 at a certain time, the output signal of the comparator CP101 is driven Low and the transistors Q108 and Q109 are turned OFF. While the transistor Q108 is turned OFF, the reference voltage Vt1 is the upper limit voltage Vb of the triangular wave signal as shown in FIG. 10. The upper limit voltage Vb is represented by Expression (16).

$$Vb = Vc \times R104/(R103+R104) \qquad (16)$$

When the transistor Q109 is turned OFF, a current flows into the base of the transistor Q107 from the resistor R108 so that the transistor Q107 is turned ON. When the transistor Q7 is turned ON, supply of a collector current I5 is stopped. As a result, a collector current I3 flows, which discharges the electric charges accumulated on the capacitor C101 and the voltage across the terminals of the capacitor C101 decreases. The voltage VC1 of the capacitor C101 rises.

When the voltage VC1 of the capacitor C101 exceeds the upper limit voltage Vb even by a small amount, the output signal of the comparator CP101 is driven High, which turns ON the transistors Q108 and Q109. While the transistor Q108 is turned ON, without considering the saturation voltage of the transistor Q108, the reference voltage Vt1 becomes a resistance dividing voltage of the composite resistance value of the resistors R104 and R105 and the resistance value of the resistor R103, and as shown in FIG. 10, becomes the lower limit voltage Va of the triangular wave signal. The lower limit voltage Va is represented by Expression (17).

$$Va = Vc \times (R104 \times R105)/(R103 \times R104 + R103 \times R105 + R104 \times R105) \qquad (17)$$

When the transistor Q109 is turned ON, a current does not flow from the resistor R8 to the base of the transistor Q107. This turns OFF the transistor Q107. When the transistor Q107 is turned OFF, supply of the collector current I5 starts. The collector current I5 is double the collector current I3. Thus, subtracting the collector current I3 from the collector current I5, the collector current I3 flows so that the capacitor C101 is charged with electric charges. When the capacitor C101 is charged, the voltage across the terminals of the capacitor C101 increases. Thus, the voltage VC1 of the capacitor C101 drops. When the voltage VC1 of the capacitor C101 drops below the lower limit voltage Va even by a small amount, the output signal of the comparator CP101 is inverted to Low. These operations are repeated to generate the triangular wave signal shown in FIG. 10.

The period T of the triangular wave signal is represented by Expression (18).

$$T = 2 \times (Vb - Va) \times C101/I1 = \qquad (18)$$
$$[2 \times Vc \times \{(R104/(R103+R104) - (R104 \times R105)/$$
$$(R103 \times R104 + R103 \times R105 + R104 \times R105)\} \times$$
$$C101]/[\{(Vc - V_{BE1})/R101\}$$

When the triangular wave signal supplied from the triangular wave generation circuit 1, that is, the voltage VC1 of the capacitor C101 exceeds the reference voltage Vk, the output signal of the comparator CP102 of the PWM generation circuit 2 is driven Low. When the voltage VC1 of the capacitor C101 drops below the reference voltage Vk, the output signal of the comparator CP102 is driven High. These operations are repeated to generate the PWM signal shown in FIG. 10.

The output signal of the comparator CP2, that is, the PWM signal is supplied to the driving circuit 4 via the OR gate 3. The driving circuit 4 amplifies and inverts the logical value of the PWM signal supplied from the OR gate 3 and applies a driving voltage to the MOSFET 122. While the driving voltage applied from the driving circuit 4 is High, the MOSFET 122 has its gate voltage driven High so that it is turned ON. The source voltage of the MOSFET 122 is almost equal to the ground voltage. As shown in FIG. 10, a load current flows into a load 6, or a lamp 11 in this example.

In case the driving voltage from the driving circuit 4 is Low, the MOSFET 122 is turned OFF. Thus, the source voltage of the MOSFET 122 rises until it is almost equal to the battery voltage $V_{bat}$. As shown in FIG. 10, a load current does not flow into a load 6, or a lamp 111 in this example.

These operations are repeated to drive the lamp 111 to blink based on the supplied driving voltage.

For example, in case the capacitor C101 has shorted by some cause in this normal operation, the voltage VC1 of the capacitor C101 becomes a constant voltage Vc. The constant voltage Vc is higher than the reference voltage Vk as understood from Expression (15). Thus, the voltage VC1 of the capacitor C101 is higher than the reference voltage Vk. Thus, the output signal of the comparator CP102, that is, the PWM signal is fixed to Low level.

The PWM signal fixed to Low level is supplied to the driving circuit 4 via the OR gate 3. The driving circuit 4 amplifies and inverts the logical value of the PWM signal supplied from the OR gate 3 and keeps applying a High driving voltage to the MOSFET 122. While the driving voltage that is fixed to High level is applied from the driving circuit 4, the MOSFET 122 is maintained ON and keeps feeding a load current to the lamp 111. In other words, the lamp 111 keeps lighting with a 100% duty ratio.

In this case, low beams are used for DRL so that the lamp 111 in constant lighting does not present no particular problems. The lighting state of the lamp 111 ensures safety of the people on the vehicle, pedestrians and oncoming vehicles so that the lighting state is rather favorable from the viewpoint of a fail-safe design.

(2) In case a vehicle where this load control device is mounted high beams for DRL:

In this case, one terminal of the capacitor C101 is inserted into a through hole made almost in the center of the land L2 formed at an end of the pattern P2 and the other terminal of the capacitor C101 is inserted into a through hole made almost in the center of the land L3 formed at an end of the pattern P3. Next, for example by melting cream solder previously applied on the lands L2 and L3, one terminal of the capacitor C101 and the land L2 are electrically connected to each other and the other terminal of the capacitor C101 and the land L3 are electrically connected to each other.

Next, operation of the load control device of the above configuration will be described. In case the control signal supplied from the ECU 113 is High, the output signal of the OR gate 3 is always High. The driving circuit 4 amplifies and inverts the logical value of High level supplied from the OR gate 3 and applies a Low driving voltage to the MOSFET 122. While the Low driving voltage is applied from the driving circuit 4, the MOSFET 122 is turned OFF. In this case, the source voltage of the MOSFET 122 is almost equal to the battery voltage $V_{bat}$ so that a load current does not flow into a load 6, or a lamp 11 in this example.

In case the control signal supplied from the ECU 113 is Low, the output signal of the comparator CP102 of the PWM generation circuit 2 serves as an output signal of the OR gate 3.

In case the voltage VC1 of the capacitor C101 is lower than the reference voltage Vt1 at a certain time, the output signal of the comparator CP1 is driven Low and the transistors Q108 and Q109 are turned OFF. While the transistor Q108 is turned OFF, the reference voltage Vt1 is the upper limit voltage Vb of the triangular wave signal.

When the transistor Q109 is turned OFF, a current flows into the base of the transistor Q107 from the resistor R108 so that the transistor Q107 is turned ON. When the transistor Q107 is turned ON, supply of a collector current I5 is stopped. As a result, a collector current I3 flows, which charges the capacitor C101 with electric charges and the voltage across the terminals of the capacitor C101 increases. The voltage VC1 of the capacitor C101 rises.

When the voltage VC1 of the capacitor C101 exceeds the upper limit voltage Vb even by a small amount, the output signal of the comparator CP101 becomes "H" level and the transistors Q108 and Q109 are turned ON. While the transistor Q108 is turned ON, the reference voltage Vt1 becomes the lower limit voltage Va of the triangular wave signal.

When the transistor Q109 is turned ON, a current does not flow from the resistor R108 to the base of the transistor Q107. This turns OFF the transistor Q107. When the transistor Q107 is turned OFF, supply of the collector current I5 starts. The collector current I5 is double the collector current I3 as mentioned above. Thus, subtracting the collector current I3 from the collector current I5, the collector current I3 flows so that the electric charges accumulated on the capacitor C101 are discharged.

When the electric charges accumulated on the capacitor C101 are discharged, the voltage across the terminals of the capacitor C101 decreases. Thus, the voltage VC1 of the capacitor C101 drops. When the voltage VC1 of the capacitor C101 drops below the lower limit voltage Va even by a small amount, the output signal of the comparator CP101 is inverted to Low. These operations are repeated to generate the triangular wave signal. The period T of the triangular wave signal is represented by Expression (18) mentioned above.

When the triangular wave signal supplied from the triangular wave generation circuit 1, that is, the voltage VC1 of the capacitor C101 exceeds the reference voltage Vk, the output signal of the comparator CP102 of the PWM generation circuit 2 is driven Low. When the voltage VC1 of the capacitor C101 drops below the reference voltage Vk, the output signal of the comparator CP102 is driven High. These operations are repeated to generate the PWM signal.

The output signal of the comparator CP102, that is, the PWM signal is supplied to the driving circuit 4 via the OR gate 3. The driving circuit 4 amplifies and inverts the logical value of the PWM signal supplied from the OR gate 3 and applies a driving voltage to the MOSFET 122. While the driving voltage applied from the driving circuit 4 is High, the MOSFET 122 is turned ON. The source voltage of the MOSFET 122 is almost equal to the ground voltage, and thus a load current flows into a lamp 111 in this example.

In case the driving voltage from the driving circuit 4 is Low, the MOSFET 122 is turned OFF. Thus, the source voltage of the MOSFET 122 rises until it is almost equal to the battery voltage $V_{bat}$. As a result, a load current does not flow into a lamp 111.

These operations are repeated to drive the lamp 111 to blink based on the supplied driving voltage.

For example, in case the capacitor C101 has shorted by some cause in this normal operation, the voltage VC1 of the capacitor C101 becomes 0V. The voltage VC1 of the capacitor C101 is 0V and thus is lower than the reference voltage Vk in Expression (15). The output signal of the comparator CP102, i.e., the PWM signal, is fixed to High level.

The PWM signal fixed to High level is supplied to the driving circuit 4 via the OR gate 3. The driving circuit 4 amplifies and inverts the logical value of the PWM signal supplied from the OR gate 3 and keeps applying a Low driving voltage to the MOSFET 122. While the driving voltage that is fixed to Low level is applied from the driving circuit 4, the MOSFET 122 is maintained OFF and maintains a state where a load current does not flow into the lamp 111. In other words, the lamp 111 stays OFF.

In this case, the high beams are used for DRL so that the lamp 111 stays OFF. There is no possibility of glare occurring on the eyes of the driver of a vehicle in front or an oncoming vehicle, thus previously preventing a traffic accident.

In this way, according to Fourth embodiment of the invention, the triangular wave generating circuit 1 is configured such that a triangular wave signal of the same frequency and same shape is generated in a first interposing state where a capacitor C101 for setting the frequency is interposed between the constant voltage Vc and the non-inverted input terminal of the comparator CP101 and a second interposing state where the capacitor C101 is interposed between a ground and the non-inverted input terminal of the comparator CP101.

According to the fourth embodiment of the invention, for example, as shown in FIG. 9, patterns P1 to P3 for mounting the capacitor C101 for frequency setting are formed on a printed circuit board where a load control device is mounted, in accordance with the capacitor C101 and the first or second interposing form. In case a vehicle where the load control device is mounted uses the low beams for DRL, both terminals of the capacitor C101 are electrically connected to the land L1 of the pattern P1 and the land L2 of the pattern P2. In case a vehicle where the load control device is mounted uses the high beams for DRL, both terminals of the capacitor C1 are electrically connected to the land L2 of the pattern P2 and the land L3 of the pattern P3.

It is thus possible to enhance the safety of the load control device assumed when the capacitor C101 has shorted. With a vehicle using low beams for DRL, a fail-safe design is ensured. With a vehicle using high beams for DRL, safety is enhanced. It is unnecessary to manufacture two types of printed circuit boards depending on the type of vehicle using the load control device. This contributes to reduced costs.

Fifth Embodiment

Figure 11:
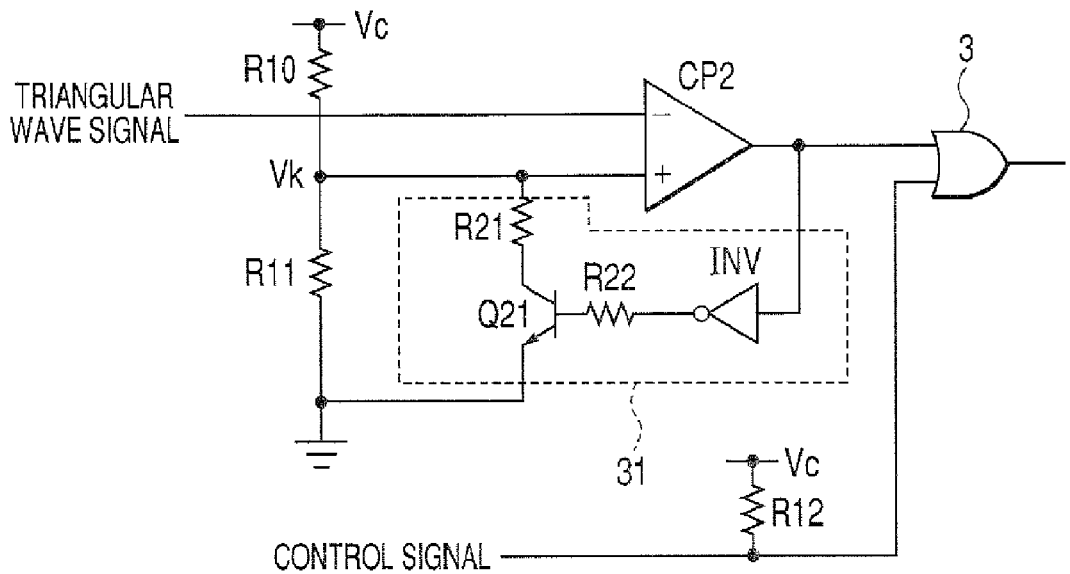
FIG. 11 shows an exemplary configuration of a comparator CP2 and its peripheral circuitry according to a fifth embodiment of the invention.

While the comparator CP2 (CP102) does not exhibit hysteresis in each of the foregoing embodiments, the invention is not limited thereto but the comparator CP2 (CP102) may exhibit hysteresis. FIG. 11 is a circuit diagram showing an exemplary configuration of a comparator CP2 (CP102) and its peripheral circuitry where a hysteresis circuit 31 is added to the comparator CP2 (CP102).

The hysteresis circuit 31 is composed of an inverter INV, a PNP transistor Q21, and resistors R21 and R22. The inverter INV inverts the output signal of the comparator CP2 (CP102), that is, the PWM signal. The resistor R22 is a base resistor connected between the base of the transistor Q21 and the output end of the inverter INV. The PNP transistor Q21 changes the reference voltage Vk when it is turned ON by a High output signal of the inverter INV supplied via the resistor R22. Configuration of the other parts of the load control device than the comparator CP2 (CP102) and its peripheral circuitry may be the same as that in FIG. 2 in the first embodiment, the same as that in FIG. 5 in the second embodiment, the same as that in FIG. 6 in the third embodiment, and the same as that in FIG. 8 in the fourth embodiment.

Next, operation of the comparator CP2 (CP102) and its peripheral circuitry of the load control device will be described referring to the timing chart shown in FIG. 12.

In case a triangular wave signal supplied from the triangular wave generation circuit 1 is above a reference voltage Vk, the output signal of the comparator CP2 (CP102) of the PWM generation circuit 2 is driven Low. The output signal of the inverter INV is driven High and the transistor Q21 is turned ON.

Figure 12:
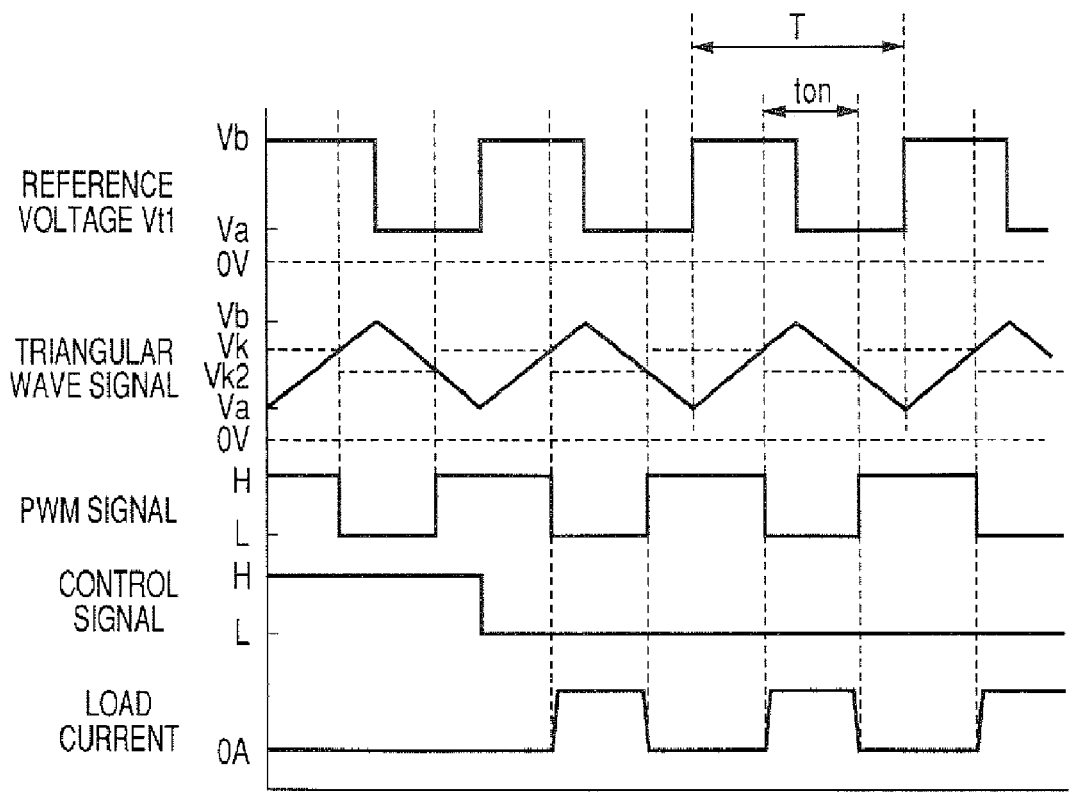
FIG. 12 is a timing chart used to illustrate an exemplary operation of the comparator CP2 and its peripheral circuitry shown in FIG. 11.

While the transistor Q21 is turned ON, without considering the saturation voltage of the transistor Q21, the reference voltage Vk becomes a resistance dividing voltage of the composite resistance value of the resistors R11 and R21 and the resistance value of the resistor R10, and as shown in FIG. 12, becomes a second reference voltage Vk2. The second reference voltage Vk2 is represented by Expression (19).

$$Vk2 = Vcx\{(R11 \times R21)/(R11+R21)\}/[R10+(R11 \times R21)/(R11+R21)] \quad (19)$$

Next, when the triangular wave signal drops below the second reference voltage Vk2, the output signal of the comparator CP2 (CP102) is driven High. Thus, the output signal of the inverter INV is driven Low and the transistor Q21 is turned OFF. While the transistor Q21 is turned OFF, the reference voltage Vk2 changes to a value represented by Expression (6) as shown in FIG. 12. In other words, the comparator CP2 has hysteresis. These operations are repeated to generate a PWM signal with a larger pulse width than in the foregoing embodiments as shown in FIG. 12. In this way, according to Fifth embodiment, the comparator CP2 (CP102) has hysteresis so that a noise resistance can be enhanced further than the above embodiments.

Sixth Embodiment

While the invention is applied to a device (low-side switching device) that includes an N-channel MOSFET 22 as a load driving element 5 arranged downstream a lamp 11 as a load 6 in the foregoing embodiments, the invention is not limited thereto. For example, the invention may be applied to a device (high-side switching device) that includes an N-channel MOSFET 22 as a load driving element 5 arranged upstream a lamp 11 as a load 6. In this case, a P-channel MOSFET may be used in place of an N-channel MOSFET 22 as a load driving element 5.

Seventh Embodiment

While an N-channel MOSFET 22 or a P-channel MOSFET is used as a load driving element 5 in the foregoing embodiments, the invention is not limited thereto. The load driving element 5 may be a bipolar transistor, a thyristor, an IGBT (Insulated Gate Bipolar Transistor), an SIT (Static Induction Transistor) or any other type of switching element.

While embodiments of the invention have been detailed referring to drawings, specific configurations of the invention are not limited thereto but modifications to the design within the scope of the invention are also included in the invention.

For example, while the constant voltage power source 21 is provided in the above embodiments, the invention is not limited thereto but the constant voltage power source 21 may be done without. In this case, in the first embodiment, the emitter of each of the transistors Q1 to Q4 and one end of each of the resistors R4, R9, R10 and R12 are directly connected to the power terminal Tb. In the second embodiment, the emitter of each of the transistors Q2 to Q4, the cathode of the Schottky barrier diode D2, and one end of each of the resistors R4, R9, R10 and R12 are directly connected to the power terminal Tb. In the third embodiment, the emitter of each of the transistors Q2 to Q4, the thermistor TH1, and one end of each of the resistors R4, R9, R10 and R12 are directly connected to the power terminal Tb. Note that, in Third embodiment, the connecting position of the thermistor TH1 may be changed with that of the resistor R1.

Also, while the constant voltage power source 21 is provided in the above embodiments, the invention is not limited thereto. The constant voltage power source 21 may be not provided to the load control device. In this case, the emitter of each of the transistors Q1 to Q3 (Q101 to Q103) and one end of each of the resistors R3, R8, R9 and R11 (R103, R108, R109 and R111) are directly connected to the power terminal Tb. The pattern P1 to which one terminal of the capacitor C1 (C101) is to be connected is also directly connected to the power terminal Tb.

While the patterns P1 to P3 shown in FIG. 9 are formed on a printed circuit board in the foregoing embodiments, the invention is not limited thereto. For example, the following configuration may be used. One terminal of the capacitor C101 is electrically connected to the land of a pattern that is connected to the non-inverted input terminal of the comparator CP101. The pattern P2 shown in FIG. 9 is formed in a very short length and the other terminal of the capacitor C101 is electrically connected to one land (not shown in FIG. 9). In case an automobile where this load controller is mounted uses low beams for DRL, a jumper pin is electrically connected across the lands L1 and L2 shown in FIG. 9. In case an automobile where this load controller is mounted uses high beams for DRL, a jumper pin is electrically connected across the lands L2 and L3 shown in FIG. 9.

While the load control device according to the invention is mounted on a vehicle, and the load 6 is a lamp 11 used as a headlamp in the above embodiments, the invention is not limited thereto. The invention may be generally applied to a device for controlling a load based on the generated PWM signal or the like.

The foregoing embodiments may use techniques of each other unless its purpose and configuration are not contradictory or problematic.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2006-161862 filed on Jun. 12, 2006 and Japan Patent Application No. 2006-161873 filed on Jun. 12, 2006, the contents of which are incorporated herein for reference.

What is claimed is:

1. A load control device, comprising:
   a triangular wave generation portion which generates a triangular wave signal having a desired frequency by charging/discharging a capacitor based on a constant current supplied from a constant current source;
   a load control portion which controls a load based on the triangular wave signal; and a temperature compensation element coupled to the constant current source, said temperature compensation element having a characteristic which changes with a rise in temperature in order to change the frequency of the triangular wave signal in response to a temperature change.

2. The load control device according to claim 1, wherein the load control portion includes:
   a pulse width modulation wave generation portion which generates a pulse width modulation wave signal based on the triangular wave signal; and
   a load driving portion which supplies a load current to the load based on the pulse width modulation wave signal.

3. The load control device according to claim 1, wherein the temperature compensation element is a diode having a characteristic that the reverse-direction leakage current increases with the rise in temperature.

4. The load control device according to claim 1, wherein the temperature compensation element is a thermistor having a characteristic that the resistance value drops with the rise in temperature.

5. The load control device of claim 1, wherein the frequency of the triangular wave signal is changed when the operating temperature is higher than a particular temperature.

6. The load control device of claim 1, wherein the frequency is reduced in response to increased temperature.

7. A load control device for controlling a load based on a generated triangular wave signal, comprising:
   a triangular wave generation portion having a first interposing state where a capacitor for setting the frequency of the triangular wave signal is interposed between a power source and an input end of a comparison portion and a second interposing state where the capacitor is interposed between a ground and the input end of the comparison portion, said triangular wave generation portion generating said triangular wave signal with the same frequency in each of said first and second interposing states, and
   connection circuitry for connecting said capacitor such that said triangular wave generation portion is configured in either the first interposing state or the second interposing state.

8. The load control device according to claim 7, further comprising:
   a pulse width modulation wave generation portion which generates a pulse width modulation wave signal based on the triangular wave signal; and
   a load control portion which controls the load based on the pulse width modulation wave signal.

9. The load control device of claim 7, wherein
   the first interposing state, said capacitor is directly connected to said power and said input end of the comparison portion; and
   the second interposing state, said capacitor is directly connected to ground and said input end of said comparison portion.

10. The load control device of claim 7, wherein
    the first interposing state causes said load control device to operate the load at a 100% duty cycle if the capacitor is disabled; and
    the second interposing state causes said load control device to disable the load if the capacitor is disabled.

* * * * *